(12) United States Patent
Lee et al.

(10) Patent No.: US 8,803,162 B2
(45) Date of Patent: Aug. 12, 2014

(54) ORGANIC LIGHT EMITTING DISPLAY OF MOTHER SUBSTRATE UNIT AND METHOD OF FABRICATING THE SAME

(75) Inventors: Ho Seok Lee, Yongin-si (KR); Won Kyu Kwak, Seongnam-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 1535 days.

(21) Appl. No.: 11/540,066

(22) Filed: Sep. 29, 2006

(65) Prior Publication Data

US 2007/0176185 A1    Aug. 2, 2007

(30) Foreign Application Priority Data

Jan. 27, 2006 (KR) .................. 10-2006-0008806

(51) Int. Cl.
*H01L 27/15* (2006.01)
*H01L 51/52* (2006.01)

(52) U.S. Cl.
CPC ....... *H01L 51/5237* (2013.01); *H01L 2251/566* (2013.01)
USPC ........................................... 257/79; 257/787

(58) Field of Classification Search
CPC .................. H01L 51/5237; H01L 2251/566
USPC ..................... 257/79, 787; 438/115
See application file for complete search history.

(56) References Cited

U.S. PATENT DOCUMENTS 4,238,704 A    12/1980  Bonk et al.
4,418,284 A *  11/1983  Ogawa et al. ............. 250/208.1
4,610,079 A *  9/1986   Abe et al. .................. 438/462

(Continued)

FOREIGN PATENT DOCUMENTS

| JP | 09-278483 | 10/1997 |
|----|-----------|---------|
| JP | 10-074583 | 3/1998  |
| TW | 200533234 | 10/2005 |

OTHER PUBLICATIONS

Taiwanese Office Action dated Jan. 20, 2010 in Taiwanese Patent Application No. 095145106.

*Primary Examiner* — Ori Nadav
(74) *Attorney, Agent, or Firm* — Knobbe, Martens, Olson & Bear, LLP (57) ABSTRACT

A mother substrate unit organic light emitting display in which grooves are formed on the internal surface where a scribing line is formed to scribe a mother substrate on which a plurality of display panels are formed into unit display panels so that a scribing process is easily performed and a method of fabricating the same are disclosed. The mother substrate unit organic light emitting display includes a first substrate including a plurality of display panels and a scribing line defined between the display panels such that each display panel includes a pixel region in which an organic light emitting diode (OLED) including a first electrode, an organic layer, and a second electrode is formed and a non-pixel region, a second substrate that is arranged on the first substrate to overlap the first substrate and on which grooves are formed to correspond to the scribing line, and a plurality of frits provided between the first substrate and the second substrate and formed along the circumference of the pixel regions. The first substrate and the second substrate are attached to each other by the plurality of frits.

13 Claims, 8 Drawing Sheets

(56) References Cited

U.S. PATENT DOCUMENTS

| | | |
|---|---|---|
| 6,225,741 B1 * | 5/2001 | Nakamura et al. ............ 313/506 |
| 6,555,025 B1 | 4/2003 | Krupetsky et al. |
| 6,580,094 B1 * | 6/2003 | Yamazaki et al. .............. 257/79 |
| 6,734,083 B2 * | 5/2004 | Kobayashi .................... 438/462 |
| 7,306,346 B2 * | 12/2007 | Fukuoka et al. ................ 362/84 |
| 2003/0218422 A1 * | 11/2003 | Park et al. ..................... 313/512 |
| 2005/0269926 A1 | 12/2005 | Fukuoka et al. |
| 2007/0172971 A1 * | 7/2007 | Boroson ......................... 438/26 |

\* cited by examiner

ORGANIC LIGHT EMITTING DISPLAY OF MOTHER SUBSTRATE UNIT AND METHOD OF FABRICATING THE SAME

CROSS-REFERENCE TO RELATED APPLICATIONS

This application claims the benefit of Korean Patent Application No. 10-2006-0008806, filed on Jan. 27, 2006, in the Korean Intellectual Property Office, the disclosure of which is incorporated herein by reference.

BACKGROUND OF THE INVENTION

1. Field of the Invention

The present invention relates to organic light emitting display device, and more particularly, to mass production of organic light emitting display devices.

2. Description of the Related Technology

Recently, organic light emitting displays are widely used among organic semiconductor devices and have a simple structure. The organic light emitting displays are self-emission displays in which organic layers are used as emission layers and do not require additional back light in order to emit light unlike liquid crystal displays (LCD). The organic light emitting displays are thin and light. Therefore, recently, the organic light emitting displays are actively developed as display panels of portable information terminals such as portable computers, mobile telephones, and portable game devices, and electronic books.

In a typical organic light emitting display, at least one organic layer including an emission layer is interposed between a pair of electrodes, that is, a first electrode and a second electrode. The first electrode is formed on a substrate and functions as an anode that injects holes. An organic layer is formed on the first electrode. A second electrode that functions as a cathode that injects electrons is formed on the organic layer to face the first electrode.

In such an organic light emitting display, when moisture or oxygen permeates from the outside to an organic light emitting diode (OLED), an electrode material is oxidized and separated so that the life span of the OLED is reduced, that emission efficiency deteriorates, and that emission color changes.

Therefore, in fabricating the organic light emitting display, the OLED is sealed from the outside so that moisture cannot penetrate. In order to seal up the OLED, for example, a polymer such as polyethyleneteraphthlate (PET) is laminated on the cathode of the OLED. Alternatively, a cover or cap is formed of a metal or glass that includes an absorbent. The cover or cap may be filled with a nitrogen gas, and the circumference of the cover or cap may be sealed up by a sealing material such as epoxy.

However, in such a method, it is difficult to make the substrate and the cap tightly attached to each other and to precisely apply the sealing material and thus the OLED is deteriorated and deformed by heat emitting from the OLED.

In order to solve the above problems, a capsule sealing method of improving attachment between the substrate and the cap using a frit as the sealing material has been proposed. In order to commercialize the organic light emitting display using a frit seal, the organic light emitting display is not fabricated using a unit display panel, but is fabricated using a mother substrate unit display panel. That is, after a plurality of display panels are fabricated simultaneously, they are cut or scribed into individual display panel.

When the mother substrate unit display panel using the frit seal is scribed into unit display panels, tension occurs due to heat during a process of annealing or melting the frit. Thus, a scribing crack is irregularly transmitted during the scribing process and the scribing section is formed irregularly. Therefore, the size of the unit display panel varies.

SUMMARY OF CERTAIN INVENTIVE ASPECTS

One aspect of the invention provides an organic light emitting device. The device comprises: a first substrate; a second substrate generally opposing the first substrate; two or more arrays of organic light emitting pixels interposed between the first and second substrates; and two or more frit seals interposed between the first and second substrates, a first one of the frit seals surrounding a first one of the arrays, a second one of the frit seals surrounding a second one of the arrays, the first frit seal comprising a first elongated segment, the second frit seal comprising a second elongated segment, wherein the first and second elongated segments extending with a gap therebetween; wherein at least one of the first and second substrates comprises a dividing groove on a surface thereof, the dividing groove being positioned along the gap between the first and second elongated segments.

The second substrate may comprise a substantially transparent material so as to pass visible light emitted from the organic light emitting pixels, and the second substrate may comprise the dividing groove. The second substrate may comprise an outer surface and an inner surface, and the second substrate may comprise the dividing groove on at least one of the outer and inner surfaces. The first substrate may comprise an outer surface and an inner surface, and the first substrate may comprise the dividing groove on one of the outer and inner surfaces. The dividing groove may have a depth of about 30% to about 50% of the thickness of the substrate comprising the dividing groove. The dividing groove may have a width between about 50 μm and about 100 μm.

The first and second elongated segments may extend substantially parallel to each other. The device may further comprise two or more reinforcing members interposed between and bonded to the first and second substrates, the two or more reinforcing members comprising a first reinforcing member and a second reinforcing member, wherein the first reinforcing member extends substantially parallel to the first elongated segment, and wherein the second reinforcing member extends substantially parallel to the second elongated segment.

The first reinforcing member may be positioned between the first elongated segment and the second elongated segment, and the dividing groove may be positioned between the first reinforcing member and the second elongated segment. The second reinforcing member may be positioned between the first reinforcing member and the second elongated segment, and the dividing groove may be positioned between the first reinforcing member and the second reinforcing member. The reinforcing members may comprise one or more selected from the group consisting of cyanoacrylate, acrylate, epoxy, and urethaneacrylate resin. The first elongated segment may be positioned between the first reinforcing member and the second elongated segment, and the dividing groove may be positioned between the first elongated segment and the second elongated segment.

Another aspect of the invention provides an organic light emitting device, comprising: a first substrate; a second substrate generally opposing the first substrate, the second substrate having an outer surface, an inner surface, and a plurality of sides interconnecting the outer and inner surfaces; an array of organic light emitting pixels interposed between the first and second substrates; and a frit seal interposed between the first and second substrates, the frit seal surrounding the array; wherein at least one of the sides comprises two leveled surfaces, which comprise a first surface and a second surface connected to the first surface with a step or a slanted surface, wherein the first and second surfaces extend substantially parallel to each other.

The first surface may connect to the inner surface of the second substrate, and the second surface may connect to the outer surface of the second substrate. The first surface may have a width extending in a direction interconnecting the outer and inner surfaces of the second substrate in the shortest distance, and the width may be between about 30% to about 50% of the thickness of the second substrate in the direction.

Another aspect of the invention provides a method of making an organic light emitting display. The method comprises: providing a device comprising: a first substrate, a second substrate generally opposing the first substrate, two or more arrays of organic light emitting pixels interposed between the first and second substrates, and two or more frit seals interposed between the first and second substrates, a first one of the frit seals surrounding a first one of the arrays, a second one of the frit seals surrounding a second one of the arrays, the first frit seal comprising a first elongated segment, the second frit seal comprising a second elongated segment, wherein the first and second elongated segments extending with a gap therebetween, wherein at least one of the first and second substrates may comprise a dividing groove on a surface thereof, the dividing groove being positioned along the gap between the first and second elongated segments; and cutting the device into two pieces along the dividing groove.

The method may further comprise further cutting the device along the first frit seal so as to provide a first organic light emitting device comprising: a cut portion of the first substrate; a cut portion of the second substrate; the first frit seal interposed between the cut portions of the first and second substrates; and the first array surrounded by the frit seal.

The second substrate may comprise an outer surface and an inner surface, and the second substrate may comprise the dividing groove on at least one of the outer and inner surfaces. The dividing groove may have a depth of about 30% to about 50% of the thickness of the substrate where the dividing groove is formed. The dividing groove may have a width between about 50 μm and about 100 μm.

In the method, providing the device may comprise: providing the first substrate and the two or more arrays formed over the first substrate; providing the second substrate over the first substrate, the second substrate comprising the dividing groove; and forming the first and second frit seals between the first and second substrates such that the first elongated segment of the first frit seal is positioned on one side of the dividing groove and that the second elongated segment of the second frit seal is positioned on the other side of the dividing groove. Providing the second substrate may comprise forming the dividing groove on the surface of the second substrate.

The device may further comprise two or more reinforcing members interposed between and bonded to the first and second substrates, the two or more reinforcing members comprising a first reinforcing member and a second reinforcing member, wherein the first elongated segment and the first reinforcing member extend substantially parallel, and wherein the second elongated segment and the second reinforcing member extend substantially parallel.

The first reinforcing member and the second reinforcing member may be positioned between the first elongated segment of the first frit seal and the second elongated segment of the second frit seal, and the dividing groove may be positioned between the first reinforcing member and the second reinforcing member. The reinforcing members may comprise one or more selected from the group consisting of cyanoacrylate, acrylate, epoxy, and urethaneacrylate resin. Providing the device may further comprise curing the reinforcing members.

Another aspect of the invention provides a mother substrate unit organic light emitting display in which grooves are formed on the internal side of a scribing line along which a mother substrate where a plurality of display panels are formed is scribed into unit display panels so that a scribing process is easily performed and a method of fabricating the same.

Another aspect of the invention provides a mother substrate unit organic light emitting display comprising a first substrate including a plurality of display panels and a scribing line defined between the display panels such that each display panel includes a pixel region in which an organic light emitting diode (OLED) including a first electrode, an organic layer, and a second electrode is formed and a non-pixel region, a second substrate that is arranged on the first substrate to overlap the first substrate and on which grooves are formed to correspond to the scribing line, and a plurality of frits provided between the first substrate and the second substrate and formed along the circumference of the pixel regions. The first substrate and the second substrate are attached to each other by the plurality of frits.

The grooves may be formed on the internal surface of the second substrate. The grooves have a depth of 30% to 50% of the thickness of the second substrate. The mother substrate unit organic light emitting display further comprises stiffeners provided between the first substrate and the second substrate and formed on the circumference of the plurality of display panels. The stiffeners are formed of at least one selected from the group consisting of cyanoacrylate, acrylate, epoxy, and urethaneacrylate.

Another aspect of the invention provides a method of fabricating a mother substrate unit organic light emitting display, the method comprising the steps of providing a first substrate including a plurality of display panels and a scribing line defined between the display panels such that each display panel includes a pixel region in which an OLED including a first electrode, an organic layer, and a second electrode is formed and a non-pixel region, positioning a second substrate under the first substrate to overlap the first substrate, forming grooves on the internal surface of the second substrate to correspond to the scribing line, applying frits on the second substrate to correspond to the non-pixel regions and annealing the frits, attaching the second substrate to the first substrate so that the pixel regions are sealed up, and melting the frits to be adhered to the first substrate.

The grooves may be formed by etching or polishing. The frits may be melted by laser or infrared rays. The method further comprises the step of forming stiffeners on the second substrate outside the frits after forming the frits on the second substrate. The stiffeners are hardened by ultraviolet rays or heat. The stiffeners are formed by screen printing or dispensing.

BRIEF DESCRIPTION OF THE DRAWINGS

These and/or other objects and advantages of the invention will become apparent and more readily appreciated from the following description of embodiments, taken in conjunction with the accompanying drawings of which.

DETAILED DESCRIPTION OF CERTAIN INVENTIVE EMBODIMENTS

Hereinafter, certain inventive embodiments will be described with reference to the accompanying drawings.

An organic light emitting display (OLED) is a display device comprising an array of organic light emitting diodes. Organic light emitting diodes are solid state devices which include an organic material and are adapted to generate and emit light when appropriate electrical potentials are applied.

Figure 5A:
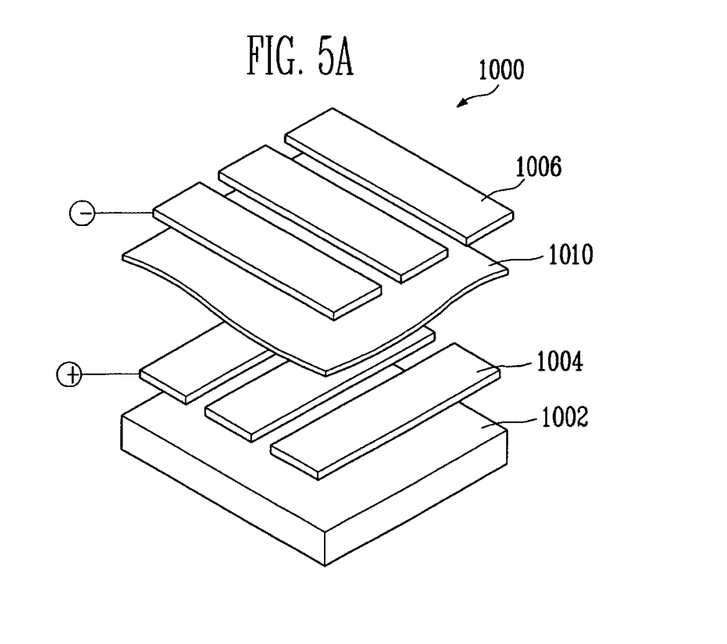
FIG. 5A is a schematic exploded view of a passive matrix type organic light emitting display device in accordance with one embodiment.
Figure 5B:
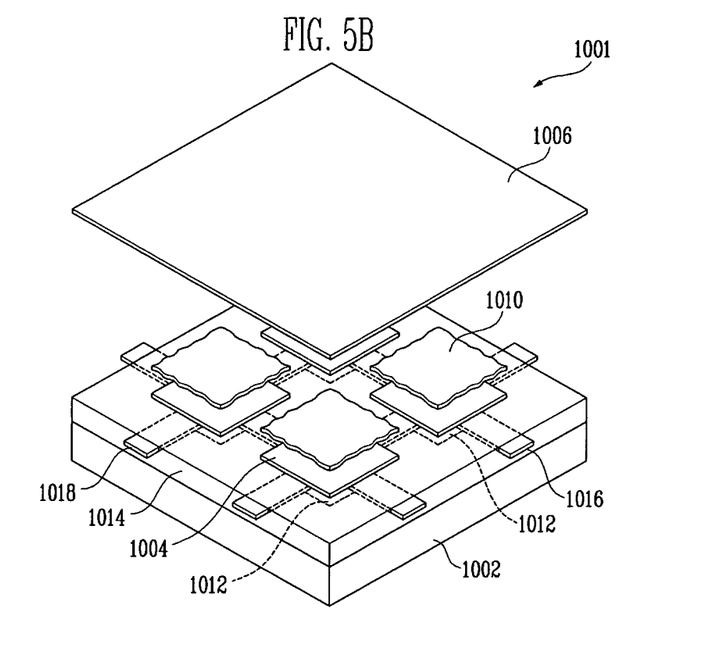
FIG. 5B is a schematic exploded view of an active matrix type organic light emitting display device in accordance with one embodiment.

OLEDs can be generally grouped into two basic types dependent on the arrangement with which the stimulating electrical current is provided. FIG. 5A schematically illustrates an exploded view of a simplified structure of a passive matrix type OLED 1000. FIG. 5B schematically illustrates a simplified structure of an active matrix type OLED 1001. In both configurations, the OLED 1000, 1001 includes OLED pixels built over a substrate 1002, and the OLED pixels include an anode 1004, a cathode 1006 and an organic layer 1010. When an appropriate electrical current is applied to the anode 1004, electric current flows through the pixels and visible light is emitted from the organic layer.

Referring to FIG. 5A, the passive matrix OLED (PMOLED) design includes elongate strips of anode 1004 arranged generally perpendicular to elongate strips of cathode 1006 with organic layers interposed therebetween. The intersections of the strips of cathode 1006 and anode 1004 define individual OLED pixels where light is generated and emitted upon appropriate excitation of the corresponding strips of anode 1004 and cathode 1006. PMOLEDs provide the advantage of relatively simple fabrication.

Referring to FIG. 5B, the active matrix OLED (AMOLED) includes local driving circuits 1012 arranged between the substrate 1002 and an array of OLED pixels. An individual pixel of AMOLEDs is defined between the common cathode 1006 and an anode 1004, which is electrically isolated from other anodes. Each driving circuit 1012 is coupled with an anode 1004 of the OLED pixels and further coupled with a data line 1016 and a scan line 1018. In embodiments, the scan lines 1018 supply scan signals that select rows of the driving circuits, and the data lines 1016 supply data signals for particular driving circuits. The data signals and scan signals stimulate the local driving circuits 1012, which excite the anodes 1004 so as to emit light from their corresponding pixels.

In the illustrated AMOLED, the local driving circuits 1012, the data lines 1016 and scan lines 1018 are buried in a planarization layer 1014, which is interposed between the pixel array and the substrate 1002. The planarization layer 1014 provides a planar top surface on which the organic light emitting pixel array is formed. The planarization layer 1014 may be formed of organic or inorganic materials, and formed of two or more layers although shown as a single layer. The local driving circuits 1012 are typically formed with thin film transistors (TFT) and arranged in a grid or array under the OLED pixel array. The local driving circuits 1012 may be at least partly made of organic materials, including organic TFT. AMOLEDs have the advantage of fast response time improving their desirability for use in displaying data signals. Also, AMOLEDs have the advantages of consuming less power than passive matrix OLEDs.

Referring to common features of the PMOLED and AMOLED designs, the substrate 1002 provides structural support for the OLED pixels and circuits. In various embodiments, the substrate 1002 can comprise rigid or flexible materials as well as opaque or transparent materials, such as plastic, glass, and/or foil. As noted above, each OLED pixel or diode is formed with the anode 1004, cathode 1006 and organic layer 1010 interposed therebetween. When an appropriate electrical current is applied to the anode 1004, the cathode 1006 injects electrons and the anode 1004 injects holes. In certain embodiments, the anode 1004 and cathode 1006 are inverted; i.e., the cathode is formed on the substrate 1002 and the anode is oppositely arranged.

Interposed between the cathode 1006 and anode 1004 are one or more organic layers. More specifically, at least one emissive or light emitting layer is interposed between the cathode 1006 and anode 1004. The light emitting layer may comprise one or more light emitting organic compounds. Typically, the light emitting layer is configured to emit visible light in a single color such as blue, green, red or white. In the illustrated embodiment, one organic layer 1010 is formed between the cathode 1006 and anode 1004 and acts as a light emitting layer. Additional layers, which can be formed between the anode 1004 and cathode 1006, can include a hole transporting layer, a hole injection layer, an electron transporting layer and an electron injection layer.

Hole transporting and/or injection layers can be interposed between the light emitting layer 1010 and the anode 1004. Electron transporting and/or injecting layers can be interposed between the cathode 1006 and the light emitting layer 1010. The electron injection layer facilitates injection of electrons from the cathode 1006 toward the light emitting layer 1010 by reducing the work function for injecting electrons from the cathode 1006. Similarly, the hole injection layer facilitates injection of holes from the anode 1004 toward the light emitting layer 1010. The hole and electron transporting layers facilitate movement of the carriers injected from the respective electrodes toward the light emitting layer.

In some embodiments, a single layer may serve both electron injection and transportation functions or both hole injection and transportation functions. In some embodiments, one or more of these layers are lacking. In some embodiments, one or more organic layers are doped with one or more materials that help injection and/or transportation of the carriers. In embodiments where only one organic layer is formed between the cathode and anode, the organic layer may include not only an organic light emitting compound but also certain functional materials that help injection or transportation of carriers within that layer.

There are numerous organic materials that have been developed for use in these layers including the light emitting layer. Also, numerous other organic materials for use in these layers are being developed. In some embodiments, these organic materials may be macromolecules including oligomers and polymers. In some embodiments, the organic materials for these layers may be relatively small molecules. The skilled artisan will be able to select appropriate materials for each of these layers in view of the desired functions of the individual layers and the materials for the neighboring layers in particular designs.

In operation, an electrical circuit provides appropriate potential between the cathode 1006 and anode 1004. This results in an electrical current flowing from the anode 1004 to the cathode 1006 via the interposed organic layer(s). In one embodiment, the cathode 1006 provides electrons to the adjacent organic layer 1010. The anode 1004 injects holes to the organic layer 1010. The holes and electrons recombine in the organic layer 1010 and generate energy particles called "excitons." The excitons transfer their energy to the organic light emitting material in the organic layer 1010, and the energy is used to emit visible light from the organic light emitting material. The spectral characteristics of light generated and emitted by the OLED 1000, 1001 depend on the nature and composition of organic molecules in the organic layer(s). The composition of the one or more organic layers can be selected to suit the needs of a particular application by one of ordinary skill in the art.

OLED devices can also be categorized based on the direction of the light emission. In one type referred to as "top emission" type, OLED devices emit light and display images through the cathode or top electrode 1006. In these embodiments, the cathode 1006 is made of a material transparent or at least partially transparent with respect to visible light. In certain embodiments, to avoid losing any light that can pass through the anode or bottom electrode 1004, the anode may be made of a material substantially reflective of the visible light. A second type of OLED devices emits light through the anode or bottom electrode 1004 and is called "bottom emission" type. In the bottom emission type OLED devices, the anode 1004 is made of a material which is at least partially transparent with respect to visible light. Often, in bottom emission type OLED devices, the cathode 1006 is made of a material substantially reflective of the visible light. A third type of OLED devices emits light in two directions, e.g. through both anode 1004 and cathode 1006. Depending upon the direction(s) of the light emission, the substrate may be formed of a material which is transparent, opaque or reflective of visible light.

Figure 5C:
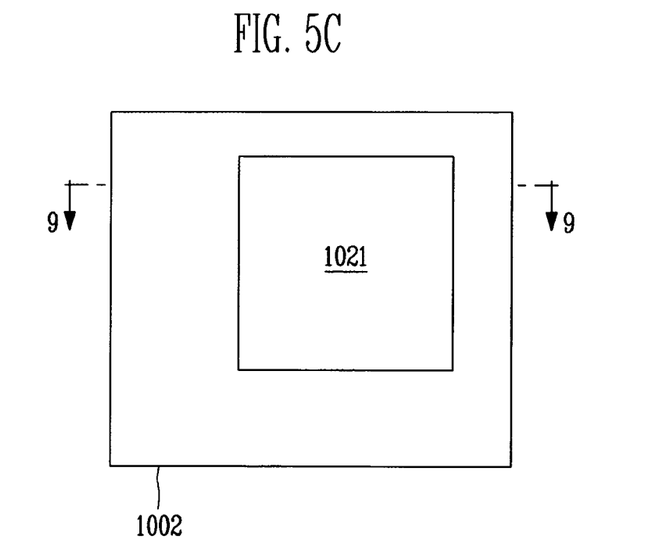
FIG. 5C is a schematic top plan view of an organic light emitting display in accordance with one embodiment.

In many embodiments, an OLED pixel array 1021 comprising a plurality of organic light emitting pixels is arranged over a substrate 1002 as shown in FIG. 5C. In embodiments, the pixels in the array 1021 are controlled to be turned on and off by a driving circuit (not shown), and the plurality of pixels as a whole displays information or image on the array 1021. In certain embodiments, the OLED pixel array 1021 is arranged with respect to other components, such as drive and control electronics to define a display region and a non-display region. In these embodiments, the display region refers to the area of the substrate 1002 where OLED pixel array 1021 is formed. The non-display region refers to the remaining areas of the substrate 1002. In embodiments, the non-display region can contain logic and/or power supply circuitry. It will be understood that there will be at least portions of control/drive circuit elements arranged within the display region. For example, in PMOLEDs, conductive components will extend into the display region to provide appropriate potential to the anode and cathodes. In AMOLEDs, local driving circuits and data/scan lines coupled with the driving circuits will extend into the display region to drive and control the individual pixels of the AMOLEDs.

Figure 5D:
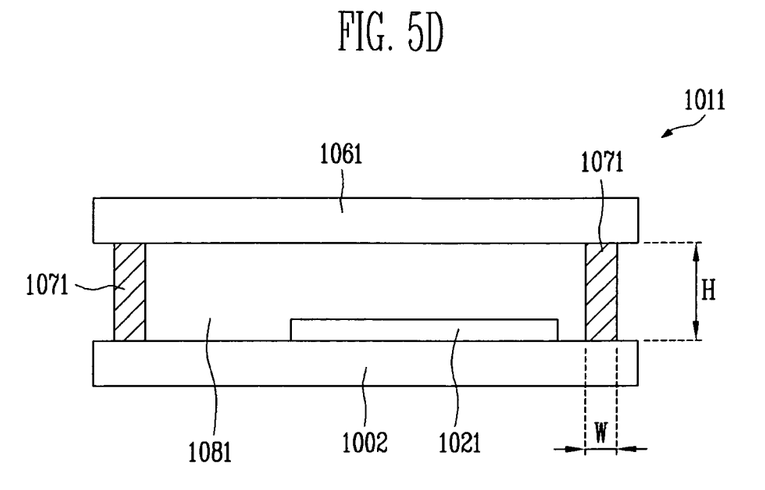
FIG. 5D is a cross-sectional view of the organic light emitting display of FIG. 5C, taken along the line d-d.

One design and fabrication consideration in OLED devices is that certain organic material layers of OLED devices can suffer damage or accelerated deterioration from exposure to water, oxygen or other harmful gases. Accordingly, it is generally understood that OLED devices be sealed or encapsulated to inhibit exposure to moisture and oxygen or other harmful gases found in a manufacturing or operational environment. FIG. 5D schematically illustrates a cross-section of an encapsulated OLED device 1011 having a layout of FIG. 5C and taken along the line d-d of FIG. 5C. In this embodiment, a generally planar top plate or substrate 1061 engages with a seal 1071 which further engages with a bottom plate or substrate 1002 to enclose or encapsulate the OLED pixel array 1021. In other embodiments, one or more layers are formed on the top plate 1061 or bottom plate 1002, and the seal 1071 is coupled with the bottom or top substrate 1002, 1061 via such a layer. In the illustrated embodiment, the seal 1071 extends along the periphery of the OLED pixel array 1021 or the bottom or top plate 1002, 1061.

In embodiments, the seal 1071 is made of a frit material as will be further discussed below. In various embodiments, the top and bottom plates 1061, 1002 comprise materials such as plastics, glass and/or metal foils which can provide a barrier to passage of oxygen and/or water to thereby protect the OLED pixel array 1021 from exposure to these substances. In embodiments, at least one of the top plate 1061 and the bottom plate 1002 are formed of a substantially transparent material.

To lengthen the life time of OLED devices 1011, it is generally desired that seal 1071 and the top and bottom plates 1061, 1002 provide a substantially non-permeable seal to oxygen and water vapor and provide a substantially hermetically enclosed space 1081. In certain applications, it is indicated that the seal 1071 of a frit material in combination with the top and bottom plates 1061, 1002 provide a barrier to oxygen of less than approximately $10^{-3}$ cc/m$^2$-day and to water of less than $10^{-6}$ g/m$^2$-day. Given that some oxygen and moisture can permeate into the enclosed space 1081, in some embodiments, a material that can take up oxygen and/or moisture is formed within the enclosed space 1081.

The seal 1071 has a width W, which is its thickness in a direction parallel to a surface of the top or bottom substrate 1061, 1002 as shown in FIG. 5D. The width varies among embodiments and ranges from about 300 µm to about 3000 µm, optionally from about 500 µm to about 1500 µm. Also, the width may vary at different positions of the seal 1071. In some embodiments, the width of the seal 1071 may be the largest where the seal 1071 contacts one of the bottom and top substrate 1002, 1061 or a layer formed thereon. The width may be the smallest where the seal 1071 contacts the other. The width variation in a single cross-section of the seal 1071 relates to the cross-sectional shape of the seal 1071 and other design parameters.

The seal 1071 has a height H, which is its thickness in a direction perpendicular to a surface of the top or bottom substrate 1061, 1002 as shown in FIG. 5D. The height varies among embodiments and ranges from about 2 µm to about 30 µm, optionally from about 10 µm to about 15 µm. Generally, the height does not significantly vary at different positions of the seal 1071. However, in certain embodiments, the height of the seal 1071 may vary at different positions thereof.

In the illustrated embodiment, the seal 1071 has a generally rectangular cross-section. In other embodiments, however, the seal 1071 can have other various cross-sectional shapes such as a generally square cross-section, a generally trapezoidal cross-section, a cross-section with one or more rounded edges, or other configuration as indicated by the needs of a given application. To improve hermeticity, it is generally desired to increase the interfacial area where the seal 1071 directly contacts the bottom or top substrate 1002, 1061 or a layer formed thereon. In some embodiments, the shape of the seal can be designed such that the interfacial area can be increased.

The seal 1071 can be arranged immediately adjacent the OLED array 1021, and in other embodiments, the seal 1071 is spaced some distance from the OLED array 1021. In certain embodiment, the seal 1071 comprises generally linear segments that are connected together to surround the OLED array 1021. Such linear segments of the seal 1071 can extend, in certain embodiments, generally parallel to respective boundaries of the OLED array 1021. In other embodiment, one or more of the linear segments of the seal 1071 are arranged in a non-parallel relationship with respective boundaries of the OLED array 1021. In yet other embodiments, at least part of the seal 1071 extends between the top plate 1061 and bottom plate 1002 in a curvilinear manner.

As noted above, in certain embodiments, the seal 1071 is formed using a frit material or simply "frit" or glass frit," which includes fine glass particles. The frit particles includes one or more of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate, etc. In embodiments, these particles range in size from about 2 μm to about 30 μm, optionally about 5 μm to about 10 μm, although not limited only thereto. The particles can be as large as about the distance between the top and bottom substrates 1061, 1002 or any layers formed on these substrates where the frit seal 1071 contacts.

The frit material used to form the seal 1071 can also include one or more filler or additive materials. The filler or additive materials can be provided to adjust an overall thermal expansion characteristic of the seal 1071 and/or to adjust the absorption characteristics of the seal 1071 for selected frequencies of incident radiant energy. The filler or additive material(s) can also include inversion and/or additive fillers to adjust a coefficient of thermal expansion of the frit. For example, the filler or additive materials can include transition metals, such as chromium (Cr), iron (Fe), manganese (Mn), cobalt (Co), copper (Cu), and/or vanadium. Additional materials for the filler or additives include $ZnSiO_4$, $PbTiO_3$, $ZrO_2$, eucryptite.

In embodiments, a frit material as a dry composition contains glass particles from about 20 to 90 about wt %, and the remaining includes fillers and/or additives. In some embodiments, the frit paste contains about 10-30 wt % organic materials and about 70-90% inorganic materials. In some embodiments, the frit paste contains about 20 wt % organic materials and about 80 wt % inorganic materials. In some embodiments, the organic materials may include about 0-30 wt % binder(s) and about 70-100 wt % solvent(s). In some embodiments, about 10 wt % is binder(s) and about 90 wt % is solvent(s) among the organic materials. In some embodiments, the inorganic materials may include about 0-10 wt % additives, about 20-40 wt % fillers and about 50-80 wt % glass powder. In some embodiments, about 0-5 wt % is additive(s), about 25-30 wt % is filler(s) and about 65-75 wt % is the glass powder among the inorganic materials.

In forming a frit seal, a liquid material is added to the dry frit material to form a frit paste. Any organic or inorganic solvent with or without additives can be used as the liquid material. In embodiments, the solvent includes one or more organic compounds. For example, applicable organic compounds are ethyl cellulose, nitro cellulose, hydroxyl propyl cellulose, butyl carbitol acetate, terpineol, butyl cellusolve, acrylate compounds. Then, the thus formed frit paste can be applied to form a shape of the seal 1071 on the top and/or bottom plate 1061, 1002.

In one exemplary embodiment, a shape of the seal 1071 is initially formed from the frit paste and interposed between the top plate 1061 and the bottom plate 1002. The seal 1071 can in certain embodiments be pre-cured or pre-sintered to one of the top plate and bottom plate 1061, 1002. Following assembly of the top plate 1061 and the bottom plate 1002 with the seal 1071 interposed therebetween, portions of the seal 1071 are selectively heated such that the frit material forming the seal 1071 at least partially melts. The seal 1071 is then allowed to resolidify to form a secure joint between the top plate 1061 and the bottom plate 1002 to thereby inhibit exposure of the enclosed OLED pixel array 1021 to oxygen or water.

In embodiments, the selective heating of the frit seal is carried out by irradiation of light, such as a laser or directed infrared lamp. As previously noted, the frit material forming the seal 1071 can be combined with one or more additives or filler such as species selected for improved absorption of the irradiated light to facilitate heating and melting of the frit material to form the seal 1071.

Figure 5E:
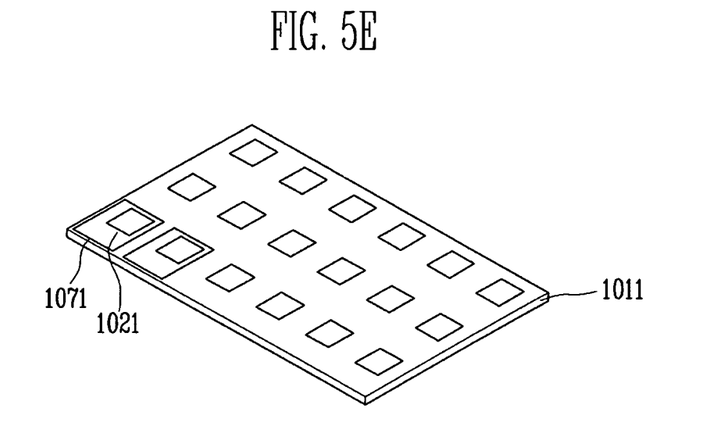
FIG. 5E is a schematic perspective view illustrating mass production of organic light emitting devices in accordance with one embodiment.

In some embodiments, OLED devices 1011 are mass produced. In an embodiment illustrated in FIG. 5E, a plurality of separate OLED arrays 1021 is formed on a common bottom substrate 1101. In the illustrated embodiment, each OLED array 1021 is surrounded by a shaped frit to form the seal 1071. In embodiments, common top substrate (not shown) is placed over the common bottom substrate 1101 and the structures formed thereon such that the OLED arrays 1021 and the shaped frit paste are interposed between the common bottom substrate 1101 and the common top substrate. The OLED arrays 1021 are encapsulated and sealed, such as via the previously described enclosure process for a single OLED display device. The resulting product includes a plurality of OLED devices kept together by the common bottom and top substrates. Then, the resulting product is cut into a plurality of pieces, each of which constitutes an OLED device 1011 of FIG. 5D. In certain embodiments, the individual OLED devices 1011 then further undergo additional packaging operations to further improve the sealing formed by the frit seal 1071 and the top and bottom substrates 1061, 1002.

Figure 1:
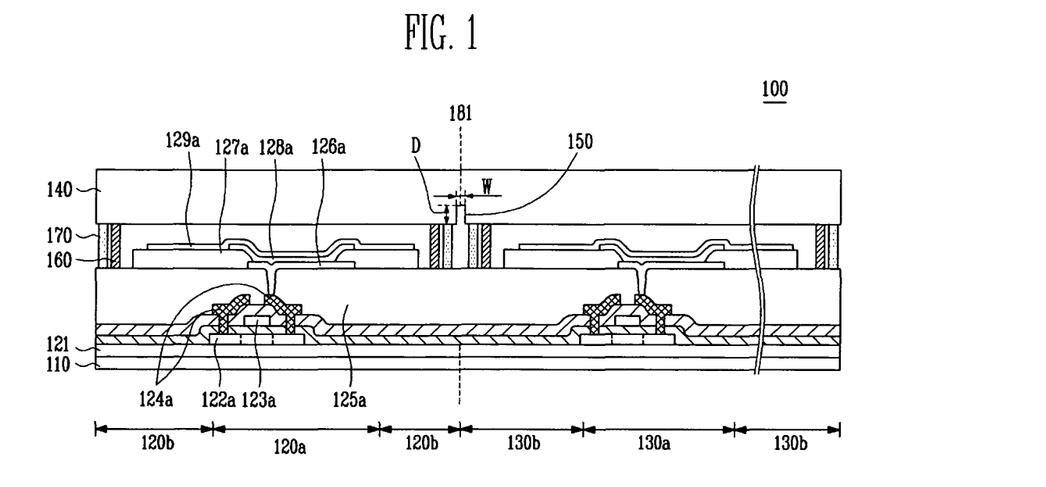
FIG. 1 is a sectional view illustrating a mother substrate unit light emitting display according to one embodiment.

FIG. 1 is a sectional view illustrating a mother substrate unit organic light emitting display. Referring to FIG. 1, the mother substrate unit organic light emitting display 100 according to one embodiment includes a plurality of display panels 120 and 130 and a scribing line 181 defined between the display panels. The display panels 120 and 130 include a first substrate 110 including pixel regions 120a and 130a and non-pixel regions 120b and 130b. In the pixel regions 120a and 130a, organic light emitting diodes (OLED) including first electrodes 126a and 136a, organic layers 127a and 137a, and second electrodes 129a and 139a are formed. The non-pixel regions 120b and 130b surround the pixel regions 120a and 130a. The display panels 120 and 130 also include a second substrate 140 that is arranged over the first substrate 110 to overlap the first substrate 110. Grooves 150 are formed on the internal surface of the second substrate 140. The grooves 150 correspond to the scribing line 181. In addition, a plurality of frits 160 are provided between the first substrate 110 and the second substrate 140 while surrounding the pixel regions 120a and 130a. The first substrate 110 and the second substrate 140 are attached to each other by the plurality of frits 160.

Hereinafter, for convenience sake, specific two display panels that are adjacent to each other among a plurality of display panels are referred to as a first display panel 120 and a second display panel 130.

The substrate 110 includes at least a first display panel 120 and a second display panel 130 adjacent to the first display panel 120. A skilled artisan will appreciate that the substrate 110 may include more display panels, for example, in a matrix pattern. The first display panel 120 includes a first pixel region 120a and a first non-pixel region 120b. The second display panel 130 includes a second pixel region 130a and a second non-pixel region 130b. The pixel regions 120a and 130a are regions on which an image is displayed. The non-pixel regions 120b and 130b are regions outside the pixel regions of the substrate. Also, since the second display panel 130 has the same configuration as that of the first display panel 120, description of the second display panel 130 is omitted. In other embodiments, however, the second display panel may have a configuration different from that of the first display panel.

A buffer layer 121a may be formed on the substrate 110. The buffer layer 121a is an optional component and is formed of a nitride layer or an oxide layer. A thin film transistor (TFT) is formed on the buffer layer 121a. The TFT includes a semiconductor layer 122a, a gate electrode 123a, and source and drain electrodes 124a. The semiconductor layer 122a is formed on the buffer layer 121a in a predetermined pattern. A gate insulation layer is formed on the semiconductor layer 122a. The gate electrode 123a of a predetermined pattern is formed on one region of the gate insulation layer. An interlayer insulation layer is formed on the gate electrode 123a. Source and drain electrodes 124a are formed on a predetermined region of the interlayer insulation layer. A planarization layer 125a is formed on the source and drain electrodes 124a and the interlayer insulation layer.

A first electrode 126a is formed on one region of the planarization layer 125a. The first electrode 126a is electrically connected to one of the source and drain electrodes 124a through a via hole. A pixel definition layer 127a including an aperture (not shown) that exposes at least one region of the first electrode 126a is formed on the first electrode 126a. An emission layer 128a is formed on the aperture of the pixel definition layer 127a. A second electrode layer 129a is formed on the emission layer 128a and the pixel definition layer 127a.

The frits 160 are provided between the non-pixel region of the first substrate 110 and the second substrate 140 to attach the first substrate 110 and the second substrate 140 to each other. The term "frit" may refer to glass in the form of powder. In the context of this document, the term "frit" may also refer to a gel-type glass obtained by adding an organic material to a powder-type glass. A frit may also refer to a solidified glass that has been hardened by radiation of laser.

Stiffeners or reinforcing members 170 are formed on the second substrate 140 outside the frits 160 to attach the first substrate 110 and the second substrate 140 to each other. The stiffeners 170 disperse the shock applied to the frits 160 when the first display panel 120 and the second display panel 130 are scribed after radiating laser onto the frits 160. In one embodiment, the stiffeners 170 include at least one polymeric material selected from the group consisting of an epoxy, acrylate, urethaneacrylate, and cyanoacrylate resin.

The second substrate 140 is attached to the first substrate 110 by the frits 160 and the stiffeners 170. The second substrate 140 is attached to the first substrate 110 by the frits 160 with organic light emitting pixels interposed therebetween. The frit protects the pixels from outside oxygen and moisture. In one embodiment, the second substrate 140 is formed of a material selected from the group consisting of $SiO_2$, SiNx, and SiOxNy.

In the illustrated embodiment, the grooves 150 are formed on the internal surface of the second substrate 140, that is, on the internal side of the scribing line 181. The grooves 150 are formed along a boundary between the non-pixel region 120b of the first display panel 120 and the non-pixel region 130b of the second display panel 130. In one embodiment, the groove 150 may have a depth D of about 30% to about 50% of the thickness of the second substrate 140. The groove 150 may have a width W between about 50μ and about 100 μm. The grooves 150 are formed on the internal side of the scribing line 181 for scribing the first display panel 120 and the second display panel 130 into unit display panels. The grooves 150 reduce the transmission length of a crack that may be generated during scribing the display panels. Also, the groove 150 improves the uniformity of the scribing line 181. Furthermore, the size of each unit display panel may be made uniform, thus improving the quality of a product.

FIGS. 2A to 2F are sectional views illustrating a method of fabricating the mother substrate unit organic light emitting display according to one embodiment. FIGS. 3A to 3F are perspective views illustrating the method of fabricating the mother substrate unit organic light emitting display according to one embodiment.

Figure 2A:
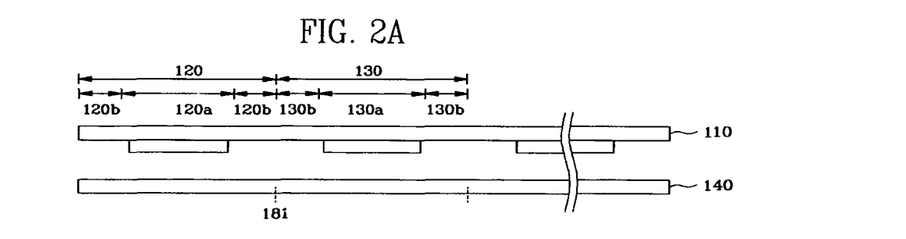
FIGS. 2A to 2F are sectional views illustrating a method of fabricating the mother substrate unit organic light emitting display according to one embodiment.
Figure 3A:
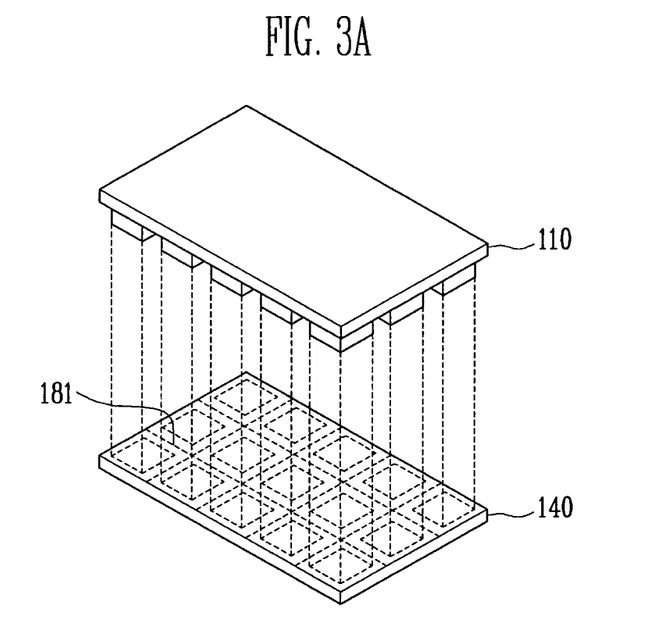
FIGS. 3A to 3F are perspective views illustrating a method of fabricating the mother substrate unit organic light emitting display according to one embodiment.

Referring to FIGS. 2A and 3A, a substrate 110 includes a first display panel 120 including a first pixel region 120a and a second non-pixel region 120b. The substrate 110 also includes a second display panel 130 adjacent to the first display panel 120. The second display panel 130 includes a second pixel region 130a and a second non-pixel region 130b. A second substrate 140 for sealing up the first substrate 110 is positioned under the first substrate 110. On the second substrate 140, a scribing line 181 is formed on a boundary between the first non-pixel region 120b of the first display panel 120 and the second non-pixel region 130b of the second display panel 130.

Figure 2B:
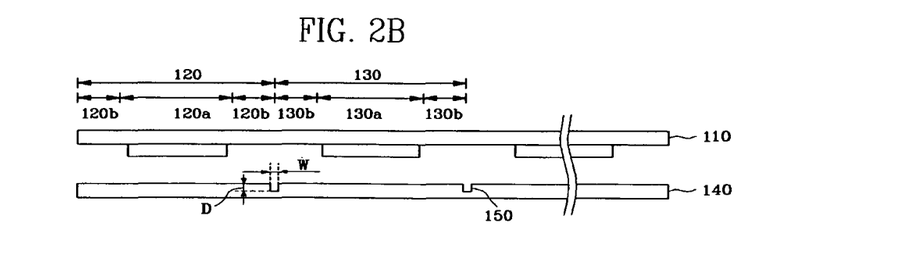
Figure 3B:
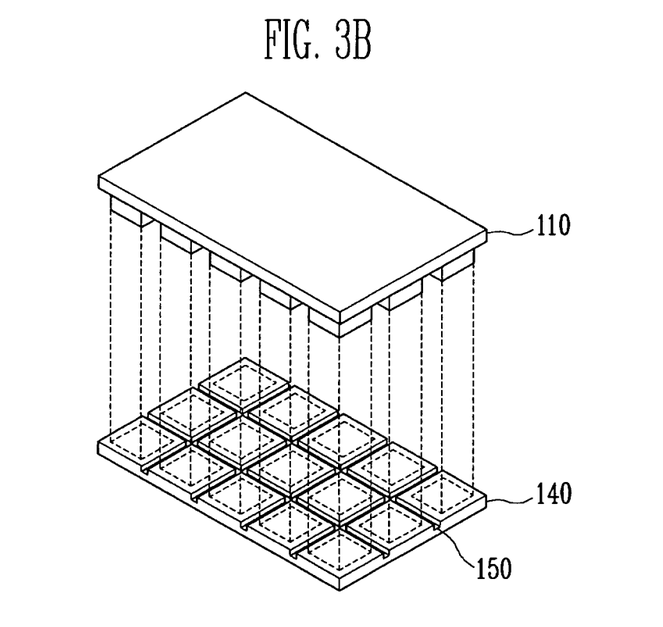

Referring to FIGS. 2B and 3B, grooves 150 are formed on the internal surface of the second substrate 140 where the scribing line 181 is formed, that is, on the second substrate 140 corresponding to the boundary between the non-pixel region 120b of the first display panel 120 and the non-pixel region 130b of the second display panel 130. The grooves 150 are patterned by etching or polishing. In one embodiment, the grooves 150 may have a depth D of about 30% to about 50% of the thickness of the second substrate 140. The grooves 150 may have a width W of about 50 μm to about 100 μm. The depth and width of the grooves 150 are limited to the extent that the strength of the second substrate 140 is not reduced.

Figure 2C:
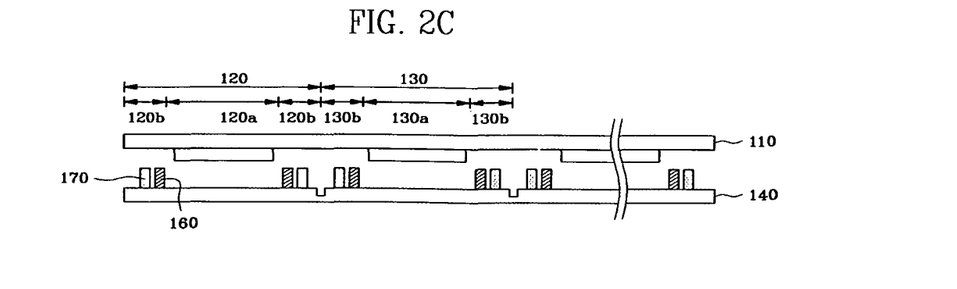
Figure 3C:
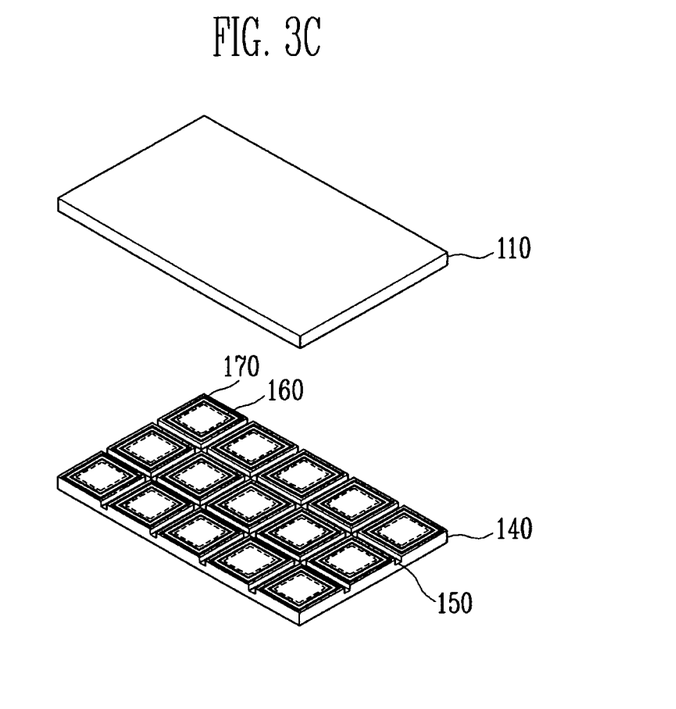

Referring to FIGS. 2C and 3C, the frits 160 are applied on the internal surface of the second substrate 140 corresponding to the non-pixel regions 120b and 130b so that the pixel regions 120a and 130a formed on the first substrate 110 are at least sealed up. That is, the frits 160 are formed outside the pixel regions of the plurality of display panels. In one embodiment, the frits 160 include a filler (not shown) for controlling a thermal expansion coefficient and an absorbent (not shown) that absorbs laser or infrared rays. In one embodiment, the frit may be obtained by adding oxide powders to glass powders. The temperature of the glass material is rapidly reduced to form the glass powders so that the frit is obtained. An organic material is added to the frit to create a gel-type paste. Then, when the frits 160 are annealed at a predetermined temperature, the organic material is removed and the gel-type frit paste is hardened so that the glass frits 160 are obtained. In one embodiment, the temperature at which the frits 160 are annealed is in the range of about 300° C. to about 700° C.

Then, the stiffeners 170 are formed on the second substrate 140 outside the frits 160. The stiffeners 170 are further formed along the inner surface of the second substrate 140 in order to improve adhesion between the first substrate 110 and the second substrate 140. In one embodiment, the stiffeners 170 are formed by screen printing or dispensing. In the screen printing method, a desired pattern is drawn on a metal sheet having a net or mesh structure. The sheet is selectively masked according to the pattern, using an emulsion solution. The stiffeners 170 are squeezed so that the desired pattern is printed on the second substrate 140. In the dispensing method, the stiffeners 170 are drawn on the second substrate 140 by an apparatus having a nozzle to have a predetermined pattern and quantity.

Figure 2D:
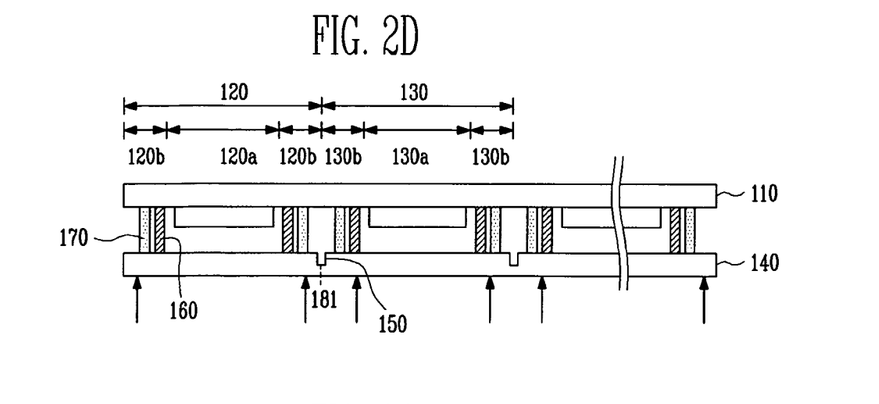
Figure 3D:
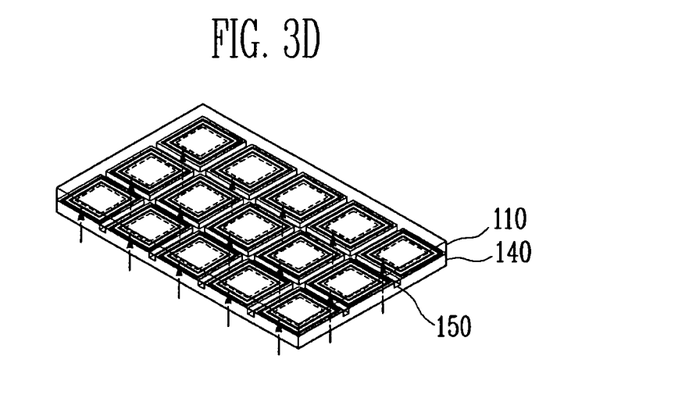

Referring to FIGS. 2D and 3D, the first substrate 110 and the second substrate 140 are attached to each other and the stiffeners 170 are hardened by the infrared rays or heat. Then, the frits 160 are irradiated with the laser or infrared rays to be melted. Therefore, the first substrate 110 and the second substrate 140 are adhered to each other.

Figure 2E:
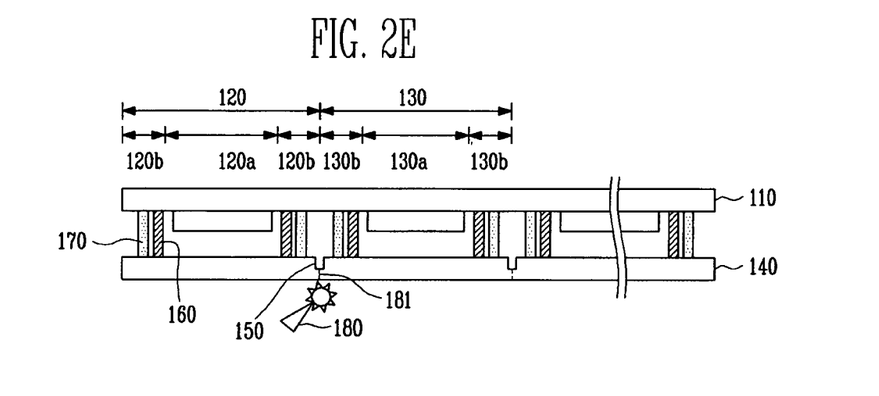
Figure 3E:
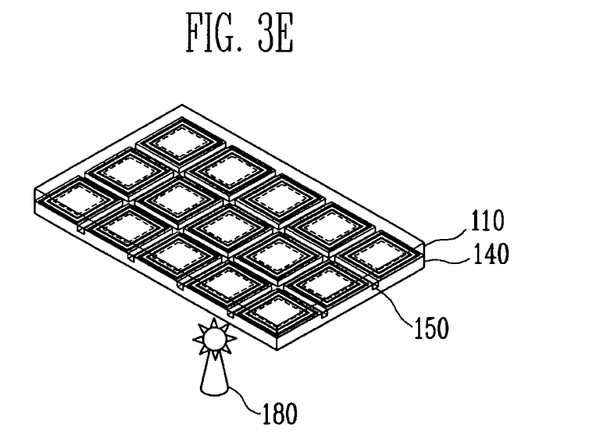

Referring to FIGS. 2E and 3E, a scribing process is performed using a scribing apparatus 180 so that the first substrate and the second substrate 140 that are attached to each other are divided into unit display panels. The scribing line 181 is formed by along a boundary between the non-pixel region 120b of the first display panel 120 and the non-pixel region 130b of the second display panel 130 and the grooves 150 are positioned on the inner side of the scribing line 181.

Figure 2F:
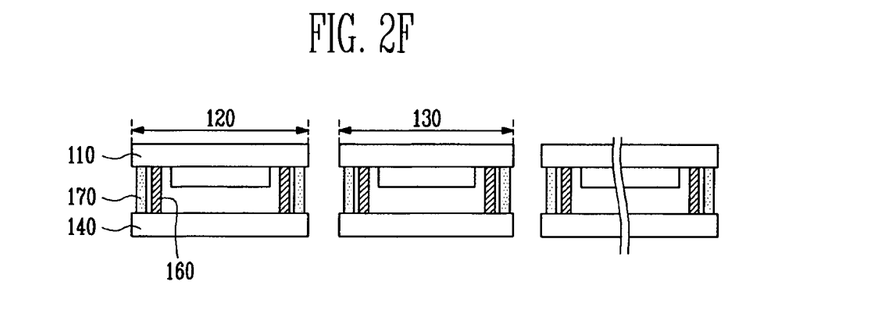
Figure 3F:
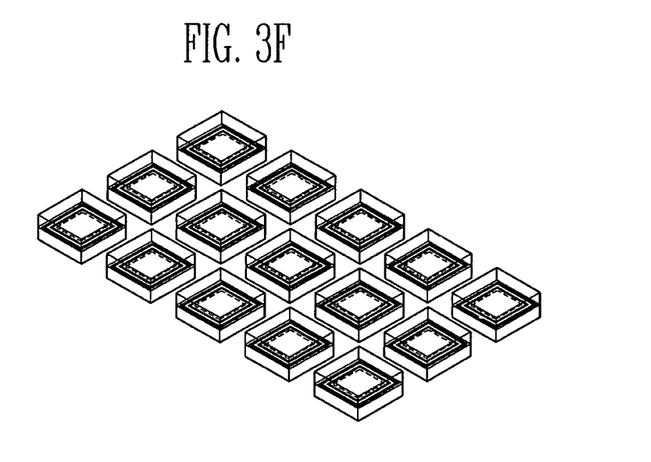

Referring to FIGS. 2F and 3F, the plurality of display panels may be fabricated into the unit display panels 120 and 130 according to the above-described method. Then, after each unit display panel is cut off and washed, a driving integrated circuit is mounted on the first substrate 110 and a polarizer is attached to the second substrate 140.

An organic light emitting device made by a method described above includes a first substrate, a second substrate generally opposing the first substrate, and an array of organic light emitting pixels interposed between the first and second substrates. In addition, a frit seal is interposed between the first and second substrates, surrounding the array. The organic light emitting display device may be a final product or a partially fabricated product.

Figure 4:
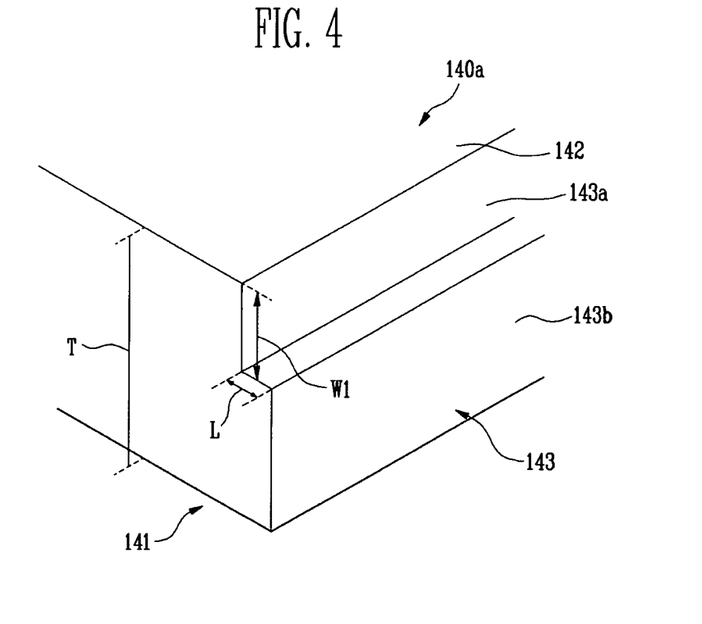
FIG. 4 is an enlarged partial perspective view of a side of a first (or second) substrate in an organic light emitting device according to one embodiment.

FIG. 4 is an enlarged partial perspective view of a side of the second substrate 140a in an organic light emitting device according to one embodiment. The second substrate may have an outer surface 141, an inner surface 142, and a plurality of sides 143 interconnecting the outer and inner surfaces 141, 142. In other embodiments, a side of the first substrate of the organic light emitting device may have the same structure as that shown in FIG. 4.

The side comprises two leveled surfaces 143a, 143b. The surfaces include a first surface 143a and a second surface 143b connected to the first surface 143a with a step or a slanted surface. Although the step on the side is depicted sharp in FIG. 4, it may be not as sharp as depicted. In addition, the surfaces 143a, 143b may not be as plain as shown in FIG. 4. The first and second surfaces 143a, 143b extend substantially parallel to each other. The first surface 143a connects to the inner surface 142 of the second substrate 140a, whereas the second surface 143b connects to the outer surface 141 of the second substrate 140a.

The first surface 143a has a width W1 extending in a direction interconnecting the outer and inner surfaces 141, 142 of the second substrate 140a in the shortest distance. In one embodiment, the width W1 is between about 30% to about 50% of the thickness T of the second substrate 140a in the direction. The first and second surfaces 143a, 143b may be at different levels by from about 5 μm to about 80 μm. A level difference L between the first and second surfaces 143a, 143b may be about 5 μm, about 10 μm, about 15 μm, about 20 μm, about 25 μm, about 30 μm, about 35 μm, about 40 μm, about 45 μm, about 50 μm, about 55 μm, about 60 μm, about 65 μm, about 70 μm, about 75 μm, and about 80 μm.

As described above, according to the embodiments, the grooves are formed on the internal side of the scribing line for scribing the mother substrate on which the plurality of display panels are formed into the unit display panels so that it is possible to easily perform the scribing process. That is, the scribing process is performed on the back of the substrate on which the grooves are formed so that it is possible to reduce the transmission length of the scribing crack. Therefore, the scribing section is uniformly scribed and the size of the scribed unit display panel is uniform.

Although a few embodiments have been shown and described, it would be appreciated by those skilled in the art that changes might be made in this embodiment without departing from the principles and spirit of the invention, the scope of which is defined in the claims and their equivalents.

What is claimed is:

1. An organic light emitting device, comprising:
    a first substrate, wherein the first substrate comprises an outer surface and an inner surface;
    a second substrate generally opposing the first substrate, wherein the second substrate comprises an outer surface and an inner surface;
    two or more arrays of organic light emitting pixels interposed between the inner surfaces of the first and second substrates; and
    two or more frit seals interposed between the first and second substrates, a first one of the frit seals surrounding a first one of the arrays, a second one of the frit seals surrounding a second one of the arrays, the first frit seal comprising a first elongated segment, the second frit seal comprising a second elongated segment, wherein the first and second elongated segments extend with a gap therebetween;
    wherein at least one of the first and second substrates comprises a dividing groove on the inner surface thereof, the dividing groove being positioned along and within the gap between the first and second elongated segments.

2. The device of claim 1, wherein the second substrate comprises a substantially transparent material so as to pass visible light emitted from the organic light emitting pixels, and wherein the second substrate comprises the dividing groove.

3. The device of claim 2, wherein the second substrate comprises the dividing groove.

4. The device of claim 2, wherein the first substrate comprises the dividing groove.

5. The device of claim 1, wherein the dividing groove has a depth of about 30% to about 50% of the thickness of the substrate comprising the dividing groove.

6. The device of claim 1, wherein the dividing groove has a width between about 50 µm and about 100 µm.

7. The device of claim 1, wherein the first and second elongated segments extend substantially parallel to each other.

8. The device of claim 1, further comprising two or more reinforcing members interposed between and bonded to the first and second substrates, the two or more reinforcing members comprising a first reinforcing member and a second reinforcing member, wherein the first reinforcing member extends substantially parallel to the first elongated segment, and wherein the second reinforcing member extends substantially parallel to the second elongated segment.

9. The device of claim 8, wherein the first reinforcing member is positioned between the first elongated segment and the second elongated segment, and wherein the dividing groove is positioned between the first reinforcing member and the second elongated segment.

10. The device of claim 9, wherein the second reinforcing member is positioned between the first reinforcing member and the second elongated segment, wherein the dividing groove is positioned between the first reinforcing member and the second reinforcing member.

11. The device of claim 8, wherein the reinforcing members comprise one or more selected from the group consisting of cyanoacrylate, acrylate, epoxy, and urethaneacrylate resin.

12. The device of claim 8, wherein the first elongated segment is positioned between the first reinforcing member and the second elongated segment, and wherein the dividing groove is positioned between the first elongated segment and the second elongated segment.

13. The device of claim 1, wherein the two or more frit seals comprise one or more materials selected from the group consisting of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate.

* * * * *